United States Patent

Inoue et al.

(10) Patent No.: US 6,617,864 B2
(45) Date of Patent: Sep. 9, 2003

(54) HIGH FREQUENCY PROBE FOR EXAMINING ELECTRIC CHARACTERISTICS OF DEVICES

(75) Inventors: Akira Inoue, Tokyo (JP); Takayuki Katoh, Tokyo (JP); Takeshi Aso, Hyogo (JP); Naofumi Iwamoto, Hyogo (JP); Takumi Suetsugu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/739,970

(22) Filed: Dec. 20, 2000

(65) Prior Publication Data

US 2001/0017549 A1 Aug. 30, 2001

(30) Foreign Application Priority Data

Feb. 25, 2000 (JP) ........................................ 2000-049404

(51) Int. Cl.$^7$ .............................................. G01R 31/02
(52) U.S. Cl. ...................... 324/754; 324/72.5; 324/149; 324/762; 333/33; 333/34; 439/482
(58) Field of Search .............................. 324/540, 158.1, 324/762, 72.5, 686, 149, 754; 333/33, 34; 439/482

(56) References Cited

U.S. PATENT DOCUMENTS 4,618,838 A * 10/1986 Kajiwara et al. ............. 333/33
5,384,558 A * 1/1995 Maruhashi .................. 333/33

FOREIGN PATENT DOCUMENTS

| JP | 9-281143 | 10/1997 |
| JP | 10-209721 | 8/1998 |

* cited by examiner

Primary Examiner—Kamand Cuneo
Assistant Examiner—Paresh Patel
(74) Attorney, Agent, or Firm—Leydig, Voit & Mayer, Ltd.

(57) ABSTRACT

A probe whose characteristic impedance can be accurately adjusted to a desired value with the production of a small number of prototypes. The probe includes a first line with a signal terminal to be connected to a signal electrode of a circuit to be measured and at least one first region connected to the signal terminal and to which one end of a chip capacitor is connected, a second line connected to a terminal of the first line and a junction to be connected to a measuring instrument at the remaining terminal, and an impedance matched to a characteristic impedance of the measuring instrument, a ground connector with a ground terminal to be connected to the ground electrode of the circuit to be measured, and at least one second region connected to the ground terminal and on which the remaining terminal of the chip capacitor is mounted in one-to-one correspondence with the first region. The impedance of the probe viewed from the circuit to be measured is provided by the chip capacitor mounted at specified positions within the first region and the second region.

7 Claims, 13 Drawing Sheets

1 : PROBE
11 : SIGNAL INPUT AND OUTPUT TERMINAL
12a,12b : GROUND TERMINAL
13 : JUNCTION OF SIGNAL LINE AND CONNECTOR
14 : CHIP CAPACITOR
15 : VIA HOLE
15a,15b : CHIP COMPONENT MOUNTING REGION
16 : 50Ω LINE
17 : LINE
18 : GROUND CONDUCTOR
20 : SUBSTRATE
21 : BACK SURFACE GROUND CONDUCTOR

- 1 : PROBE
- 11 : SIGNAL INPUT AND OUTPUT TERMINAL
- 12a,12b : GROUND TERMINAL
- 13 : JUNCTION OF SIGNAL LINE AND CONNECTOR
- 14 : CHIP CAPACITOR
- 10 : VIA HOLE
- 15a,15b : CHIP COMPONENT MOUNTING REGION
- 16 : 50Ω LINE
- 17 : LINE
- 18 : GROUND CONDUCTOR
- 20 : SUBSTRATE
- 21 : BACK SURFACE GROUND CONDUCTOR

SMITH CHART

ENLARGED

P1 : C=10pF  L=12mm
P2 : C=8pF   L=13mm
P3 : C=8pF   L=12mm
P4 : C=8pF   L=11mm
P5 : C=6pF   L=12mm

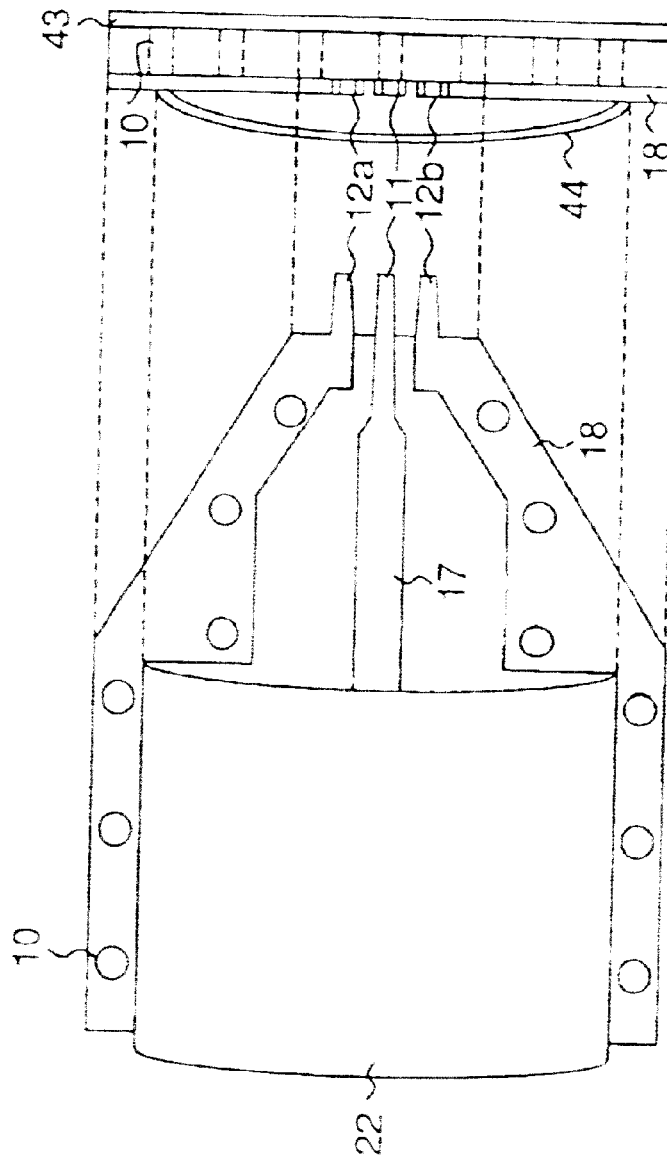

28 : SENSE LINE
29 : CHIP RESISTOR

30 : ISOLATOR
31 : LINE

20 : CHIP INDUCTOR

26 : BRANCH LINE
27 : CHIP CAPACITOR

HIGH FREQUENCY PROBE FOR EXAMINING ELECTRIC CHARACTERISTICS OF DEVICES

BACKGROUND OF THE INVENTION

The present invention relates to a probe and method for use in examining the electrical characteristics of a high-frequency semiconductor device, such as a monolithic microwave integrated circuit, which operates at a frequency of not lower than 800 MHz.

Conventionally, there has been known a probe for a high-frequency signal for use in examining the electric characteristics of a high-frequency semiconductor device, such as a monolithic microwave integrated circuit, which operates at a frequency of not lower than 800 MHz.

The characteristic impedance Zp of the probe is set equal to the characteristic impedance of the semiconductor device, or the circuit to be measured. For example, a high-frequency semiconductor device such as a monolithic microwave integrated circuit is designed so as to have a characteristic impedance of 50 Ω in a state in which a semiconductor chip is mounted on a substrate. Then, the probe used for the semiconductor device is designed so as to have a characteristic impedance Zp of 50 Ω.

FIG. 20 is a diagram showing the construction of conventional high-frequency signal probes 150a and 150b (refer to Japanese Patent Laid-Open Publication No. HEI 6-244263). In the probe 150a, terminals 154a and 154c are ground terminals and connected to a measuring instrument 151 via grounding conductors 152a and 152b. The terminal 154b is a terminal for signal input and output use and connected to the measuring instrument 151 via a conductor 153 designed so that the impedance of the probe viewed from the circuit to be measured has a desired value Zp in order to match the impedance of the probe with the circuit to be measured.

With regard to the probe 150b, terminals 174a and 174c are ground terminals and connected to the measuring instrument 151 via grounding conductors 172a and 172b. The terminal 174b is a signal input terminal and connected to the measuring instrument 151 via a conductor 173 designed so that the characteristic impedance $Z_2$ becomes Zp in order to match the impedance of the terminal with the circuit to be measured.

The electrical characteristics of the high-frequency semiconductor device that is the circuit to be measured are measured by first connecting terminals corresponding to the probes 150a and 150b to the ground electrode and the signal electrode of the semiconductor device and inputting or outputting a specified signal to or from the signal electrode via the probes 150a and 150b.

In the aforementioned conventional probes 150a and 150b it has been hard to obtain the characteristic impedance $Z_2$ equal to the designed impedance Zp due to an error caused by manufacturing inaccuracies and the influence of parasitic capacitance, parasitic inductance and so on included in the ground wiring and so on. From another point of view, it is required to produce a lot of prototypes whose parts are partially delicately changed from the designed values in order to obtain a probe having a correct characteristic impedance Zp of 50 Ω, and this has led to the problem that the manufacturing cost increases.

If a semiconductor chip is determined to be defective as the result of measurement of electric characteristics after being separated and assembled, then the whole board on which the semiconductor chip is mounted and specified wiring is provided is to be handled as a defective product, frequently resulting in waste.

The waste can be eliminated if the electrical characteristics of the semiconductor chip can be measured in the stage prior to the mounting on the board. However, in order to enable the aforementioned measurement, it is required to prepare a probe having the desired characteristic impedance Zp (not 50 Ω but, for example, 6 Ω) determined inherently in each semiconductor chip.

As described above, the conventional technique requires the production of a lot of prototypes in order to obtain a probe having a characteristic impedance Zp of the specified characteristics. For this reason, it has been impractical in terms of manufacturing cost to prepare a probe having the characteristic impedance Zp corresponding to each semiconductor chip.

FIG. 21 is a diagram showing the construction of another probe 200 for measuring a high-frequency semiconductor device, different from the aforementioned conventional probes 150a and 150b (refer to Japanese Patent Laid-Open Publication No. HEI 3-283441). In this probe 200, terminals 206a and 206b are ground terminals. The terminal 207 is a signal input and output terminal that receives a signal from a circuit board to be tested and connected to a line 208 having three branch lines 208a, 208b and 208c. The branch lines 208a, 208b and 208c have their ends provided with capacitors 209a, 209b and 209c. In designing the probe 200, the adjustment of the impedance Zp of the probe 200 can be relatively simply performed by adjusting the values of the capacitors 209a, 209b and 209c.

However, the values of the capacitors 209a, 209b and 209c can be changed discretely in steps of, for example, 1 pf. Furthermore, since the mounting positions of the capacitors are also fixed, it is difficult to accurately adjust the value of the impedance Zp to the desired value. Therefore, it is still required to produce a lot of prototypes whose parts have changed design values in order to obtain a probe of the desired impedance Zp, and therefore, the aforementioned various problems could not be effectively solved.

SUMMARY OF THE INVENTION

The object of the present invention is to provide a probe having a characteristic impedance Zp that can be accurately adjusted to a desired value with the production of a small number of prototypes. Another object of the present invention is to provide a method for using the probe in the examination of electrical characteristics of devices.

According to the first aspect of the present invention, there is provided a probe for a high-frequency signal used for an electric test in a high-frequency band of a circuit to be measured, the probe comprising: a signal terminal to be connected to a signal electrode of the circuit to be measured; a first line that has a specified impedance, one end connected to the signal terminal and at least one first region to which one end of a chip capacitor is connected; a second line that is connected to a terminal opposite to the end of the first line connected to the signal terminal and has a junction to be connected to a measuring instrument for executing the electric test at the remaining terminal and an impedance matched to the characteristic impedance of the measuring instrument; a ground terminal to be connected to the ground electrode of the circuit to be measured; and a ground conductor that is connected to the ground terminal and has at least one second region to which a remaining terminal of the chip capacitor is connected in one-to-one correspondence with the first region, wherein a chip capacitor of a specified capacitance value is mounted in specified positions within the first region and the second region so that an impedance of the probe viewed from the circuit to be measured has a desired value.

According to the probe for a high-frequency signal of the second aspect of the present invention, based on the probe of the first aspect, the ground conductor is formed on an insulating substrate having a back surface ground conductor and provided with a plurality of via holes connected to the back surface ground conductor, and an interval between each of the via holes and the signal terminal and an interval between via holes are each not greater than one fourth of a wavelength $\lambda$ of the high-frequency signal inputted to the signal terminal.

According to the probe for a high-frequency signal of the third aspect of the present invention, based on the probe of the first or second aspect, a specified chip inductor is inserted in the first line.

According to the probe for a high-frequency signal of the fourth aspect of the present invention, based on the probe of any one of the first through third aspects, a line that is branched from the ground conductor as the second region is provided, the chip capacitor is connected across the branched line and the first region, and an LC resonance circuit constructed of the branched line and the chip capacitor resonates with a higher harmonic at a multiple of the frequency of the signal inputted to the signal terminal.

According to the probe for a high-frequency signal of the fifth aspect of the present invention, based on the probe of any one of the first through fourth aspects, there is provided a high-impedance branch line that is branched from the vicinity of the signal terminal of the first line and has a terminal for detecting a potential of the signal terminal.

According to the probe for a high-frequency signal of the sixth aspect of the present invention, there is provided an isolator that has impedance characteristics corresponding to the frequency of the input signal between the first line and the second line, the impedance characteristics being identical to that of the isolator provided in the output section of the circuit to be measured.

According to the probe for a high-frequency signal of the seventh aspect of the present invention, based on the probe of any one of the first through sixth aspects, there is provided a conductor that is connected to the ground conductor and shields electromagnetic waves by covering the first line and the second line with interposition of a specified gap.

According to the present invention, there is provided a semiconductor device inspecting method using the probe of the first through seventh aspects of the present invention.

BRIEF DESCRIPTION OF THE DRAWINGS

FIGS. 10A and 10B are diagrams showing a probe provided with a shield;

DETAILED DESCRIPTION OF THE PREFERRED EMBODIMENTS (1) Overview of the Invention The probe of the present invention is characterized in that, on a line connected to a terminal for signal input and output use, a region in which the remaining terminal of a chip capacitor whose one end is connected to a ground conductor can be connected to an arbitrary position within a specified range. By adjusting the capacitance value of the chip capacitor to be mounted in the mounting region and the mounting position of the chip capacitor, a probe characteristic impedance $Z_2$ viewed from the signal input terminal can be accurately adjusted to the desired value. With this arrangement, the probe of the desired characteristic impedance can be accurately produced with a small number of prototypes.

Preferably, a chip inductor is further inserted in the line connected to the signal input terminal or a construction in which another chip capacitor mounting region is provided for the line is adopted. This enables the more accurate adjustment of the characteristic impedance $Z_2$.

Probes having the aforementioned characteristics according to the first through third embodiments will be successively described below with reference to the accompanying drawings.

(2) First Embodiment (2-1) Probe Construction

Figures 1A, 1B:
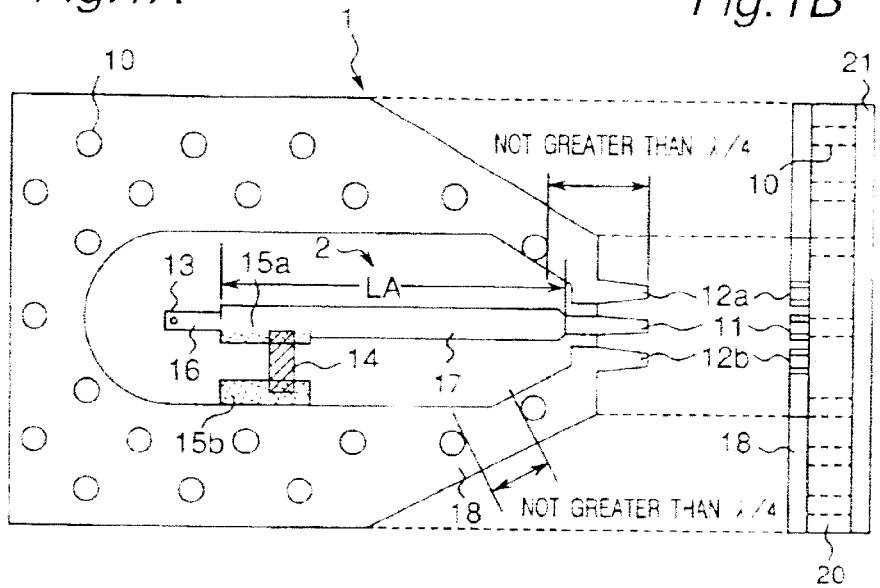
FIGS. 1A and 1B are diagrams showing the construction of a probe according to a first embodiment.

FIG. 1A shows a plan view of a probe 1 according to the first embodiment, while FIG. 1B is a side view of the probe 1 viewed from a signal input and output terminal 11. In the probe 1, an impedance matching section 2 and a ground conductor 18 are provided on the surface of a substrate 20 that has a back surface ground conductor 21. The impedance matching section 2 is constructed of a chip capacitor 14, a line 16 and a line 17. The terminals 11, 12a and 12b have shapes projecting from the substrate 20.

The signal input and output terminal 11 connected to the signal electrode of a circuit to be measured is connected to the line 17 that has a characteristic impedance ZA and a length LA. The other end of the line 17 is provided with a mounting region (dotted region in FIG. 1A) 15a of the chip capacitor 14. The mounting region 15a has no insulating film or the like so as to facilitate soldering of the chip capacitor 14. The chip capacitor 14 can be mounted in an arbitrary position of the mounting region 15a. The size of the chip capacitor 14 has the dimensions of, for example, 1.0 mm long×0.5 mm wide or 0.6 mm long×0.3 mm wide. A line 16 having a characteristic impedance of 50 Ω is provided at the other end of the mounting region 15a so as to match the impedance of the probe 1 to that of the measuring instrument to be connected. The other terminal of the line 16 is provided with a junction 13 of the line 16 and the connector (not shown) of the cable of the measuring instrument.

Terminals 12a and 12b connected to the ground electrode of the circuit to be measured are connected to the ground conductor 18. The ground conductor 18 is provided with a mounting region (dotted region in FIG. 1A) 15b to which the remaining terminal of the chip capacitor 14 is connected. A distance between the mounting region 15b and the mounting region 15a provided for the line 17 is set to a value such that the chip capacitor 14 can be mounted. The ground conductor 18 is connected to a ground conductor 21 provided on the back surface through a plurality of via holes 10 provided with interposition of a specified interval. In order to obtain a stable frequency characteristic within the intended band, a distance between each of the terminals 11, 12a and 12b and the via hole 10 located closest to each terminal and a distance between the via holes 10 are each set not greater than one fourth of the wavelength λ of a signal to be inputted to the signal input and output terminal 11. The reason for the above setting will be described later by means of experimental data.

(2—2) Explanation of Equivalent Circuit

Figure 2:
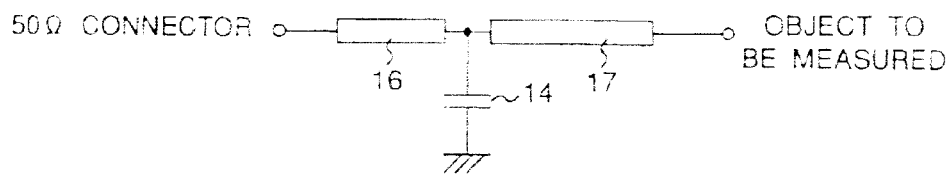
FIG. 2 is a diagram showing an equivalent circuit of the probe of the first embodiment.

FIG. 2 is a diagram showing the equivalent circuit of the probe 1. As illustrated, the equivalent circuit of the probe 1 is obtained by connecting the chip capacitor 14 of which the other terminal is grounded is connected across the line 16 and the line 17, which have respective specified impedances and are connected in series with each other. The impedance of the line 17 changes according to the position in which the chip capacitor 14 is mounted in the mounting region 15a, i.e., a distance from the terminal 11 to the mounting position. That is, by changing the mounting position of the chip capacitor 14 within the mounting region 15a and the capacitance value of the chip capacitor 14, the value of the characteristic impedance $Z_2$ of the probe 1 viewed from the signal input and output terminal 11 can be adjusted.

(2-3) Concrete Example

Figure 3A:
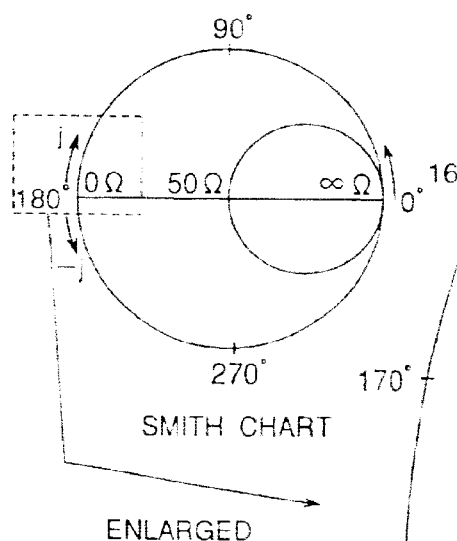
FIGS. 3A and 3B are diagrams showing the probe characteristic impedance $Z_2$ depending on the capacitance value of a chip capacitor provided for the probe and the chip capacitor mounting position.
Figure 3B:
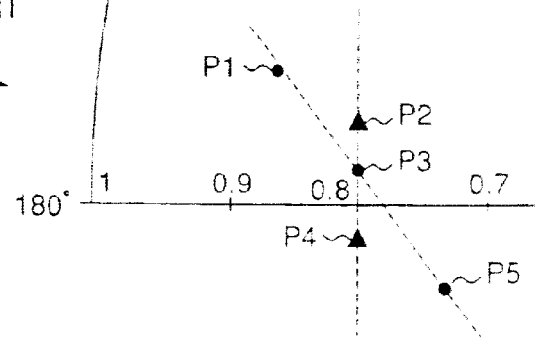

FIG. 3A is a Smith chart showing the value of the characteristic impedance $Z_2$ of the probe 1 when the mounting position of the chip capacitor 14 within the mounting region 15a and the capacitance value of the chip capacitor 14 are changed in a variety of ways, while FIG. 3B is an enlarged view of the region enclosed by the dashed lines in the Smith chart shown in FIG. 3A.

In FIG. 3B, the reference numeral P1 indicates the characteristic impedance $Z_2$ in the case where the chip capacitor 14 of 10 pf is mounted in a position 12 mm apart from the terminal 11 of the line 17. The reference numeral P2 indicates the characteristic impedance $Z_2$ in the case where the chip capacitor 14 of 8 pf is mounted in a position 13 mm apart from the terminal 11 of the line 17. The reference numeral P3 indicates the characteristic impedance $Z_2$ in the case where the chip capacitor 14 of 8 pf is mounted in a position 12 mm apart from the terminal 11 of the line 17. The reference numeral P4 indicates the characteristic impedance $Z_2$ in the case where the chip capacitor 14 of 8 pf is mounted in a position 11 mm apart from the terminal 11 of the line 17. The reference numeral P5 indicates the characteristic impedance $Z_2$ in the case where the chip capacitor 14 of 6 pf is mounted in a position 12 mm apart from the terminal 11 of the line 17.

The characteristic impedances $Z_2$ at the points of P1 through P5 each indicate the values when a signal of a frequency of 0.95 GHz is inputted. As is understood with reference to the impedances Zp indicated at the points of P1, P3 and P5, it can be found that the characteristic impedance $Z_2$ changes downward to the right in the Smith chart when the capacitance value of the chip capacitor 14 is decreased in the order of 10 pf→8 pf→6 pf in the state in which the mounting position of the chip capacitor 14 is fixed.

As is understood with reference to the impedance Zp indicated at the points of P2, P3 and P4, it can be found that the characteristic impedance $Z_2$ changes downward in the Smith chart when the distance from the signal input terminal 11 to the mounting position is changed from 13 mm→12 mm→11 mm in the state in which the chip capacitance value is fixed to 8 pf.

Figure 20:
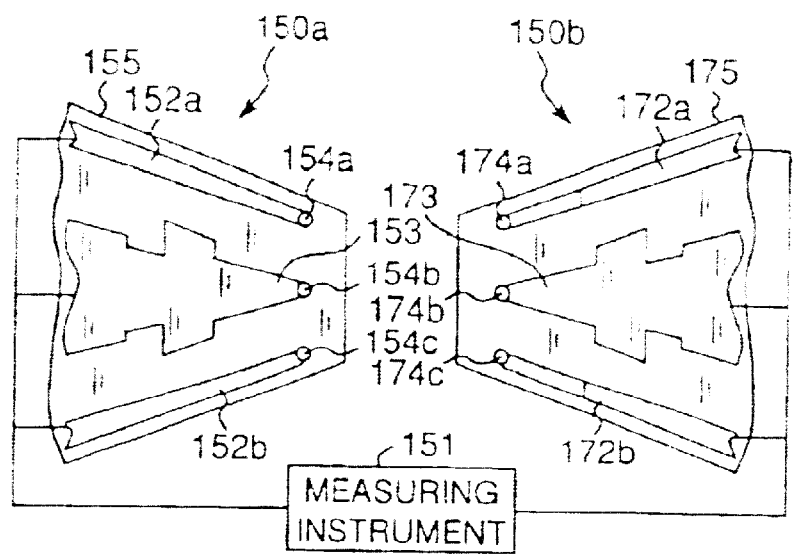
FIG. 20 is a diagram showing the construction of a conventional probe.
Figure 21:
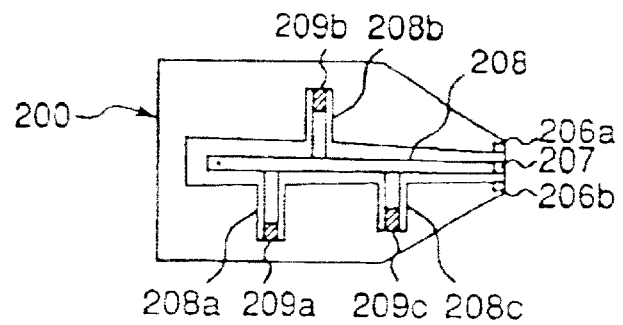
FIG. 21 is a diagram showing the construction of a conventional probe.

Taking advantage of the relation between the capacitance value of the chip capacitor 14 and $Z_2$ and the relation between the mounting position of the chip capacitor 14 and the characteristic impedance $Z_2$, the characteristic impedance $Z_2$ can be finely adjusted. By adjusting the characteristic impedance $Z_2$ according to the aforementioned method, there is the advantage that the occupation area can be reduced in comparison with the case of the probe in which the characteristic impedance $Z_2$ is set by, for example, the line width (refer to Japanese Patent Laid-Open Publication No. HEI 6-244263 shown in FIG. 20). For example, if the signal frequency is 0.95 GHz, then the length of the line 17 can be set to about 12 mm according to the probe 1 in contrast to the fact that a line of a size of 4 cm is needed in the case of impedance conversion by the line width.

It is very difficult to change the characteristic impedance $Z_2$ of the probe after the probe is manufactured according to the aforementioned conventional probe in which the characteristic impedance $Z_2$ is set by the line width. In contrast to this, the probe 1 has the advantage that the characteristic impedance $Z_2$ can be relatively simply changed by changing the mounting position of the chip capacitor 14.

(2-4) The Reason Why the Interval Between via Holes is Set Not Greater Than λ/4

According to the probe 1, in order to obtain a frequency characteristic stabilized within the intended band, the distance between the terminals 11, 12a and 12b and the via holes 10 located closest to the terminals and the distance between the via holes are each set not greater than one fourth of the wavelength λ of the signal inputted to the signal input terminal 11. The reason for the above setting will be described below.

Figure 4:
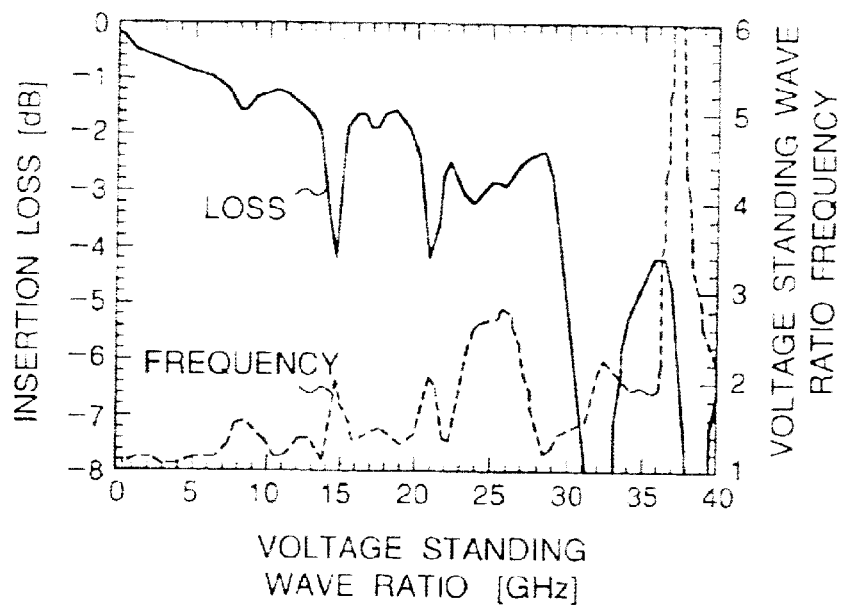
FIG. 4 is a graph showing the frequency characteristics of insertion loss and a voltage standing wave ratio when an interval between via holes is set to about $\lambda/2$.

FIG. 4 is a graph showing the frequency characteristics of a passage loss and a voltage standing wave ratio in the case where the distance between the terminals 11, 12a and 12b and the via holes 10 located closest to the terminals and the distance between the via holes 10 are each set to about one half of the wavelength λ of the applied signal (signal having a frequency of about 15 GHz in the present example) in a construction similar to that of the probe 1.

Figure 5:
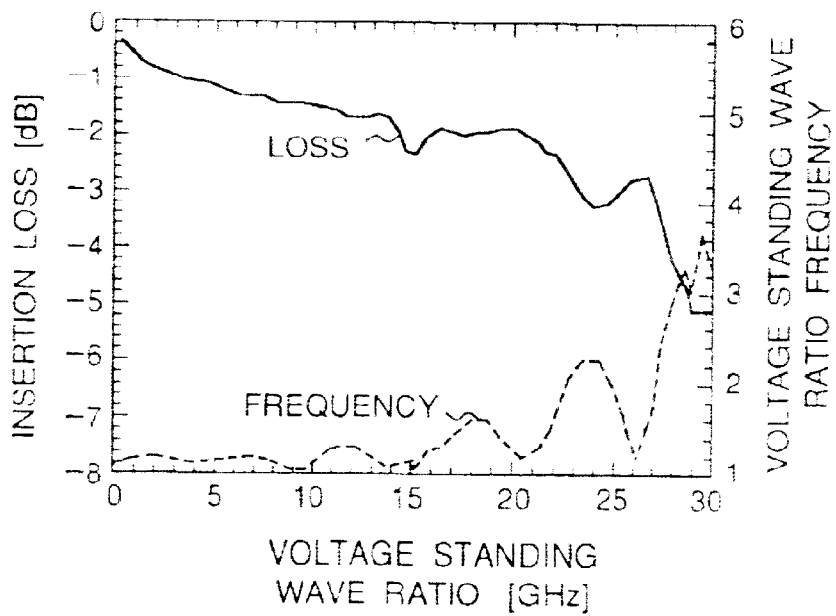
FIG. 5 is a graph showing the frequency characteristics of insertion loss and a voltage standing wave ratio when an interval between via holes is set to about $\lambda/4$.

FIG. 5 is a graph showing the frequency characteristics of the passage loss and the voltage standing wave ratio of the probe 1 in the case where the distance between the terminals 12a and 12b and the via holes 10 located closest to the terminals and the distance between the via holes 10 are each set to about one fourth of the wavelength λ of the applied signal (signal having a frequency of about 15 GHz in the present example).

As is evident when the graphs of FIG. 4 and FIG. 5 are compared with each other, sharp resonance peaks appear in a plurality of places within the intended band exhibiting an unstable frequency characteristic in the probe in which the distance between the via holes 10 is set about λ/2. In contrast to this, the probe 1 exhibits a stable frequency characteristic. This is presumably ascribed to the occurrence of a standing wave on the ground surface and the consequent resonance in the middle of the grounding points by means of the via holes 10 in the case where the distance between the via holes 10 becomes significantly greater than λ/4.

For the above reasons, the distance between the terminals 11, 12a and 12b and the via holes 10 located closest to the terminals and the distance between the via holes are each set not greater than one fourth of the wavelength λ of the applied signal (signal having a frequency of about 15 GHz in the present example) in the case of the probe 1.

(2-5) Probe Impedance Matching Method

Figure 6A:
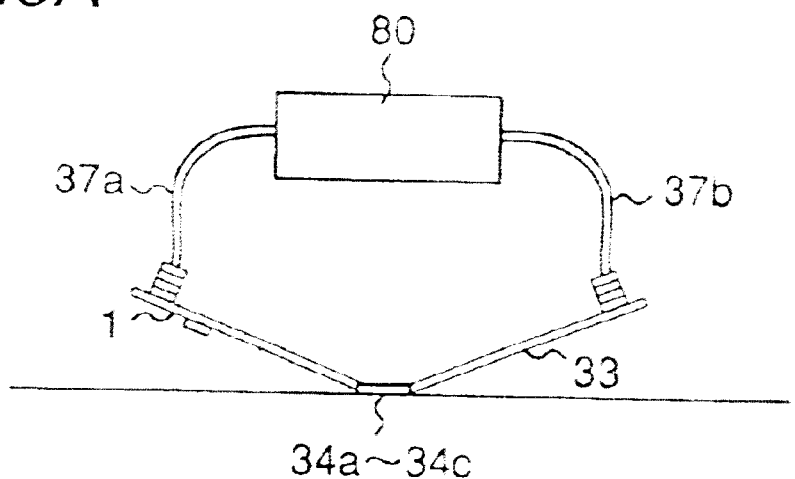
FIGS. 6A and 6B are diagrams showing a state of the characteristic impedance $Z_2$ when adjusting the impedance.
Figure 6B:
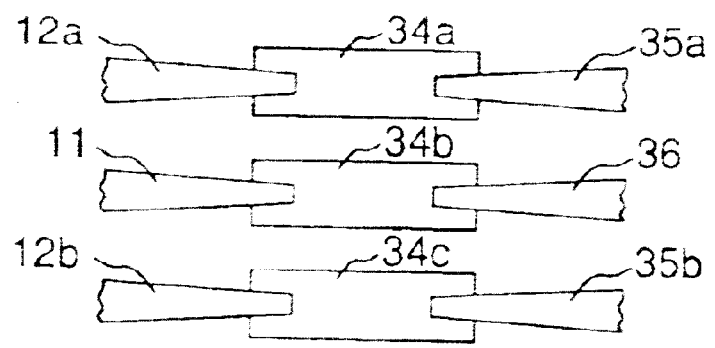

A method for adjusting the impedance Zp of the probe 1 will be described below. FIGS. 6A and 6B are diagrams showing a state in adjusting the characteristic impedance $Z_2$ of the probe 1. As shown in FIG. 6A, the characteristic impedance $Z_2$ is adjusted by the probe 1 of the first embodiment, a probe 33 which is availed on the market and of which the characteristic impedance is adjusted to 50 Ω, a measuring instrument 80 that connects the probe 1 with the probe 33 by way of a coaxial cable and through conductors 34a through 34c for electrically connecting the probe 1 with three terminals owned by the probe 33.

When adjusting the characteristic impedance $Z_2$, as shown in FIG. 6B, the ground terminal 12a of the probe 1 and the ground terminal 35a of the probe 33 are brought in contact with the through conductor 34a, the signal input and output terminal 11 of the probe 1 and the signal input and output terminal 36 of the probe 33 are brought in contact with the through conductor 34b, and the ground terminal 12b of the probe 1 and the ground terminal 35b of the probe 33 are brought in contact with the through conductor 34c.

Figure 7:
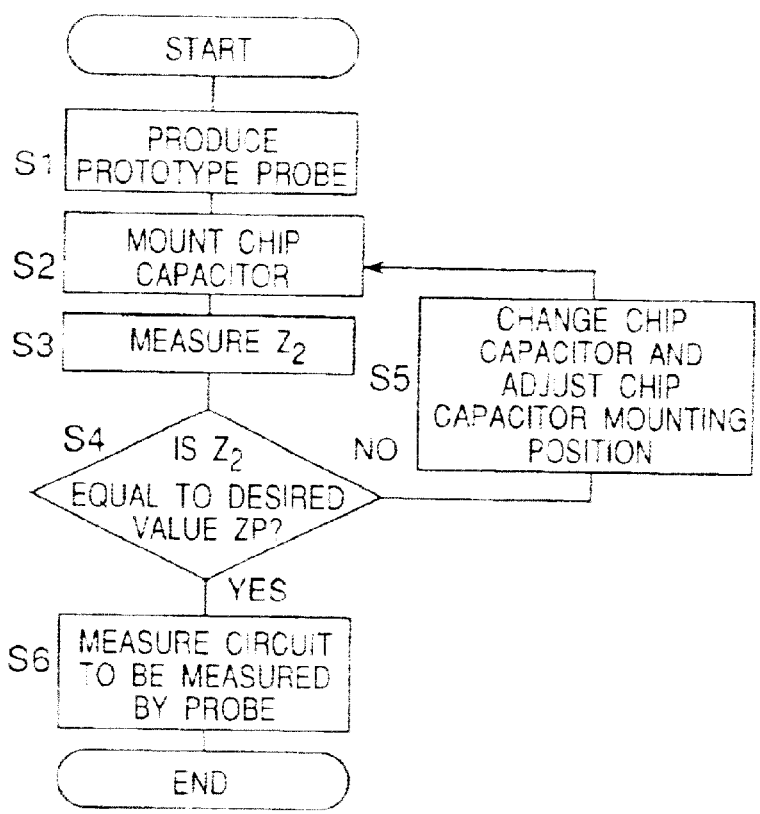
FIG. 7 is a flowchart of the process of adjusting the characteristic impedance $Z_2$.

FIG. 7 is a flowchart for adjusting and evaluating the characteristic impedance $Z_2$ of the probe 1. First, the probe 1 shown in FIG. 1 is produced as a prototype (step S1). The chip capacitor 14 is mounted in the specified positions of the mounting regions 15a and 15b of the prototype probe 1 (step S2). Soldering is general as a method for mounting the chip capacitor 14. However, another method that can easily change the mounting position may also be used.

After the mounting of the chip capacitor 14, the impedance Zp of the probe 1 is measured from the probe 33 side (step S3). If the measured value of the impedance $Z_2$ is not the desired value Zp (NO or negative in step S4), then the mounting position of the chip capacitor 14 and the capacitance value of the chip capacitor 14 are changed (step S5) and the program flow returns to step S2. If the measured characteristic impedance $Z_2$ has the desired value (YES or affirmative in step S4), then the electric characteristics of the circuit to be measured are measured by the probe 1 (step S6).

As described above, according to the probe 1, the characteristic impedance $Z_2$ can be accurately adjusted to the desired value by correcting the errors and the like caused by the manufacturing accuracy by changing the capacitance value of the chip capacitor 14 and adjusting the mounting position of the capacitor. This enables the production of a probe that has the desired characteristic impedance $Z_2$ with the production of a fewer number of prototypes.

By preparing a probe of the characteristic impedance $Z_2$ of the semiconductor chip that is the circuit to be measured, there can be measured the electric characteristics of the semiconductor chip in the wafer state or the chip state prior to assembling. This arrangement can reduce the substrate and wiring to be wasted in the defective chip detecting stage and reduce the manufacturing cost of the semiconductor device.

(2-6) Impedance Calibrating Reference Instrument

The impedance calibrating reference instrument for use in measuring an S parameter by means of the probe 1 adjusted to the specified characteristic impedance $Z_2$ will be described below.

Figure 8:
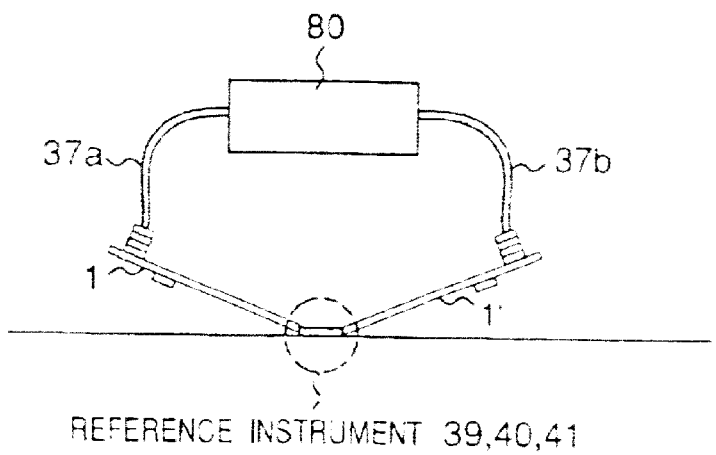
FIG. 8 is a diagram showing a state of an impedance calibrating process executed by the probe of which the characteristic impedance has been adjusted.

FIG. 8 is a diagram showing the state in executing an impedance calibrating process by means of the reference instrument described later. The impedance calibrating process is executed by connecting coaxial cables 37a and 37b of the measuring instrument 80 such as a network analyzer to the probe 1 that is adjusted to the respective identical characteristic impedances $Z_2$ and adjusting the measuring instrument 80 so that the value of the measuring instrument 80 becomes the predetermined value when the two probes 1 are brought in contact with the reference instrument described later. The probe 1 to be connected to the coaxial cable 37b will be hereinafter referred to as a probe 1' for the sake of convenience of explanation.

Figure 9A:
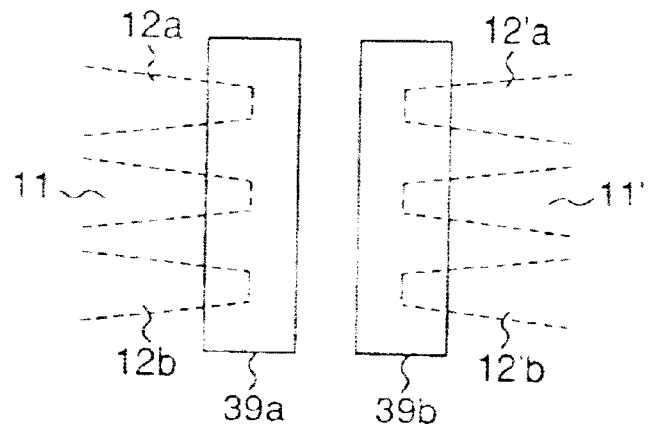
FIGS. 9A through 9C are diagrams showing reference instruments for use in the impedance calibrating stage.
Figure 9B:
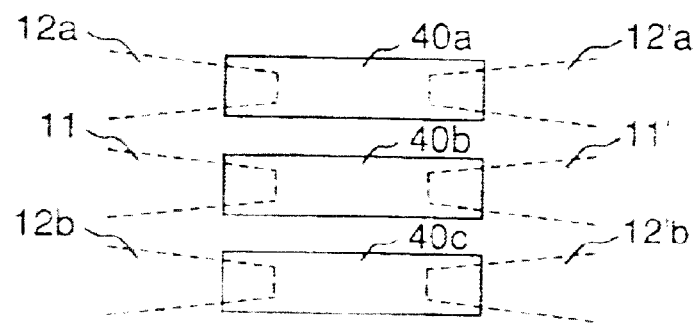
Figure 9C:
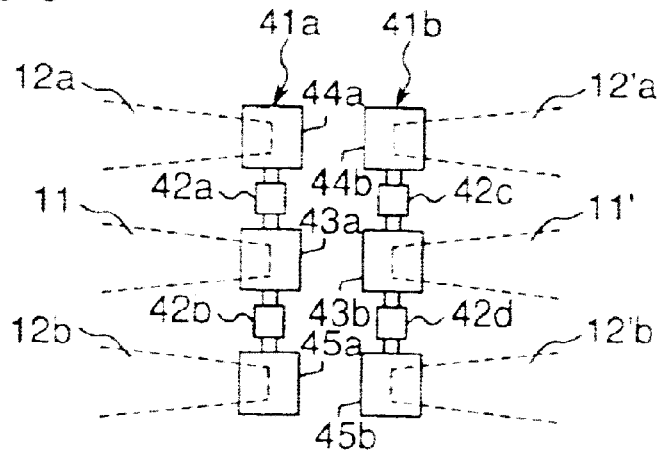

FIGS. 9A through 9C show the reference instrument to be used for impedance calibration. FIG. 9A shows a shortcircuit reference instrument 39. The shortcircuit reference instrument 39 is constructed of two conductors 39a and 39b. The conductor 39a short-circuits the ground terminals 12a and 12b of the probe 1 and the signal input and output terminal 11. The conductor 39b short-circuits the ground terminals 12'a and 12'b of the probe 1' and a signal input and output terminal 11'.

FIG. 9B shows through reference instruments 40a through 40c. The through reference instruments 40a through 40c are coplanar lines having the same characteristic impedance $Z_2$ as those of the probes 1 and 1'. The through reference instrument 40a is connected to the ground terminal 12a of the probe 1 and the ground terminal 12'a of the probe 1'. The through reference instrument 40b is connected to the signal input terminal 11 of the probe 1 and the signal input terminal 11' of the probe 1'. The through reference instrument 40c is connected to the ground terminal 12b of the probe 1 and the ground terminal 12'b of the probe 1'.

FIG. 9C shows load reference instruments 41a and 41b. The load reference instruments 41a and 41b are pattern conductors that extend to the ground conductor via a resistor whose resistance viewed from the signal conductor is equivalent to Zp. As illustrated, thin film resistors 42a through 42d having the impedance Zp are provided between pads 43a and 43b connected to the signal terminal and pads 44a, 44b, 45a and 45b connected to the ground terminal.

There is needed an open reference instrument (not shown) that disposes the terminals of the two probes 1 and 1' in the air in addition to the shortcircuit reference instrument, the through reference instruments and the load reference instruments.

If the characteristic impedance of the probe to be connected to a coaxial cable 37a is Z1 and the characteristic impedance of the probe to be connected to a coaxial cable 37b is Z2 (Z1≠Z2), then the impedance can be provided by using the through reference instruments and load reference instruments set as follows. In detail, there are adopted through reference instruments 40a', 40b' and 40c' having a coplanar line provided with a circuit for converting the impedance from Z1 to Z2 inside the pattern when viewed from the side on which the probe connected to the coaxial cable 37a in place of the through reference instruments 40a, 40b and 40c. There are adopted load reference instruments 41a', 41b' and 41c' that have the same constructions as those of the load reference instruments 41a, 41b and 41c and are provided with thin film resistors 42a' and 42b' having the resistance Z1 and thin film resistors 42c' and 42d' having the resistance Z2.

(2-7) Improved Probe Example

Generally speaking, by comparison with a probe that employs a line having a characteristic impedance of 50 Ω, a distance between the signal line and the ground conductor located on the same surface is increased in the case of a probe of which the characteristic impedance is set low. Furthermore, due to the necessity of adjustment, a large unoccupied space results. This tends to consequently cause insufficient shield of the signal power as well as the intermixture of external noises and the leak of the signal power.

In view of the above, in order to alleviate the influence and the like due to the external noises, it is preferable to provide a shield conductor on the surface that belongs to the probe 1 shown in FIG. 1 and is located on the signal terminal side. FIG. 10A is a plan view of an improved example of the probe 1 provided with the shield conductor 22, while FIG. 10B is a sectional view of the improved example of the probe 1 viewed from the terminal side. As illustrated, the shield ground conductor 22 has the upper and lower ends connected to the ground conductor 18 and is provided so as to cover the wire 16, line 17 and the chip capacitor 14 inside the probe 1 with interposition of a specified gap in a bridge-like shape or preferably cover the components completely.

According to the improved example of the probe 1 having the above construction, the intermixture of external noises and the leak of the signal power can be effectively avoided with the provision of the shield ground conductor 22.

(2-8) Terminal Forming Process

Figure 11A:
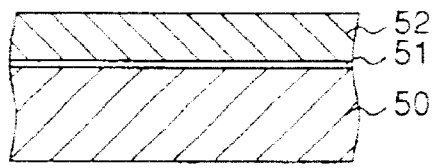
FIGS. 11A through 11H are views showing the processes of manufacturing a ground terminal and a signal input terminal of the probe.

A method for forming the ground terminals 12a and 12b that have a high aspect ratio and a rectangular cross-section shape and the signal input and output terminal 11 will be described below. FIGS. 11A through 11H are diagrams for explaining the manufacturing processes of the terminals 11, 12a and 12b of the probe 1. First, in a base metal layer forming process, a base metal layer 51 is formed by vapor depositing copper on a support metal plate 50 made of stainless steel, as shown in FIG. 11A.

Figure 11B:
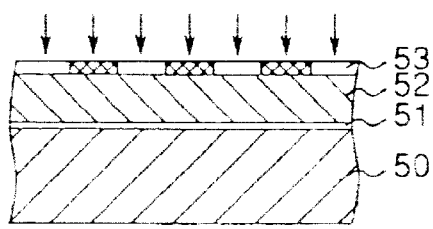
Figure 11C:
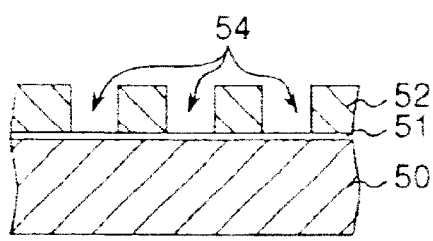

Next, in a pattern forming process, a photoresist layer 52 is first formed on the base metal layer 51. Next, as shown in FIG. 11B, a photomask 53 of a characteristic pattern is provided on the photoresist layer 52 by the known photolithography and then exposed to light. Subsequently, as shown in FIG. 11C, a photoresist layer 18 is developed to remove the photoresist layer 52 in the wiring portion including the terminals 11, 12a and 12b, forming an opening 54. It is to be noted that a photoresist of a negative type or a positive type may be used as the photoresist layer 52.

In the process described below, the photoresist layer 52 having the opening 54 is used as a mask for forming the pattern wiring. It is to be noted that a film having a hole corresponding to the opening 54 may be preparatorily used as a mask. In this case, the above-mentioned process is not necessary.

Figure 11D:
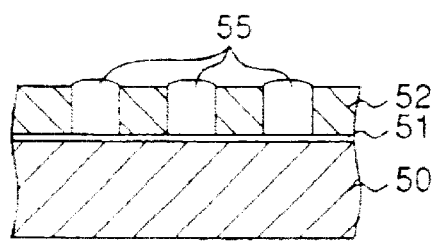
Figure 11E:
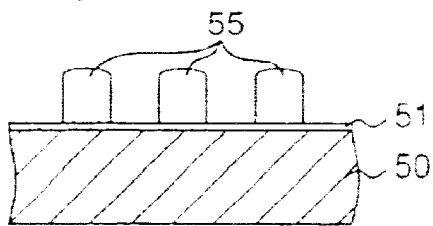

In a plating process, as shown in FIG. 11D, an Ni alloy layer 55 that serves as a wiring pattern including the terminals 11, 12a and 12b is formed by subjecting the opening 54 of the photoresist layer 52 to an electrolytic plating process. After the electrolytic plating process, as shown in FIG. 11E, the photoresist layer 52 that has been used as a mask is removed.

Figure 11F:
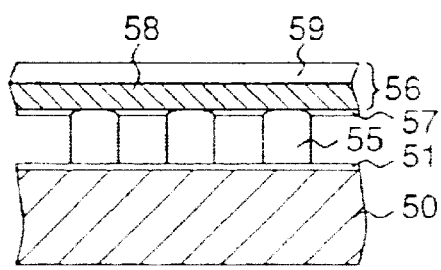

In a film depositing process, as shown in FIG. 11F, a resin film 56 is made to adhere by an adhesive 57 to a portion that belongs to the nickel (Ni) alloy layer 55 except for the terminals 11, 12a and 12b. This resin film 56 is a two-layer tape obtained by integrating a polyimide resin 58 with a metal film (copper film) 59. The polyimide resin 58 corresponds to the substrate 20 shown in FIG. 1, while the metal film 59 corresponds to the back surface ground conductor 21 shown in FIG. 1. Prior to the film depositing process, a ground surface has preparatorily been formed by subjecting the metal film 59 of the two-layer tape to copper etching by photolithography. In the film depositing process, the polyimide resin 58 of the two-layer tape is made to adhere to the nickel alloy layer 55 via an adhesive 57. The metal film 59 may be made of nickel, nickel alloy or the like in addition to copper foil.

Figure 11G:
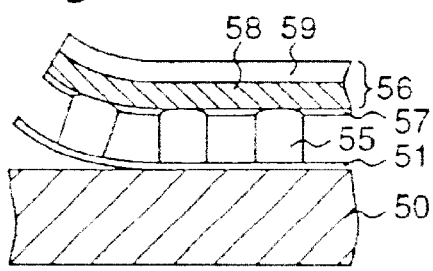

In a separating process, as shown in FIG. 11G, a portion constructed of the resin film 56, pattern wiring 55 and the base metal layer 51 is separated from the support metal plate 50 and thereafter subjected to copper etching, making the pattern wiring 55 adhere to the resin film 56.

Figure 11H:
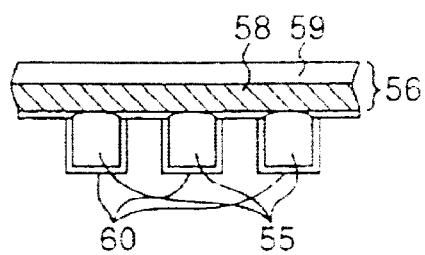

In a gold coating process, as shown in FIG. 11H, the exposed pattern wiring 55 is plated with gold. In this stage, the entire surfaces of the terminals 11, 12a and 12b that are projecting from the resin film 56 are provided with a metal layer 60.

Through the aforementioned processes, the terminals 11, 12a and 12b (pattern wiring 55) that have a high aspect ratio and a rectangular cross-section shape are formed.

(2-9) First Modification Example

A modification example of the probe 1 will be described below. Generally speaking, the electric characteristics of a semiconductor device provided on a wafer are measured by applying a bias voltage from an external bias circuit by means of the signal line of the probe. However, in this case, a voltage drop occurs due to the inclusion of a parasitic resistance of several hundred milliohms to several ohms between the bias power source and the circuit to be measured, and the desired bias voltage cannot sometimes be applied to the electrode terminal of the circuit to be measured from the signal input and output terminal.

According to the modification example of the probe 1, a sense circuit is provided near the signal input and output terminal 11. By using the sense circuit, the value of the bias voltage applied to the terminal 11 can be measured in a state in which the influence of the parasitic capacitance is reduced by an order of magnitude or further. By using a bias circuit for correcting the value of the application voltage on the basis of the potential measured by the sense circuit, more appropriate bias voltage application can be achieved.

Figure 12:
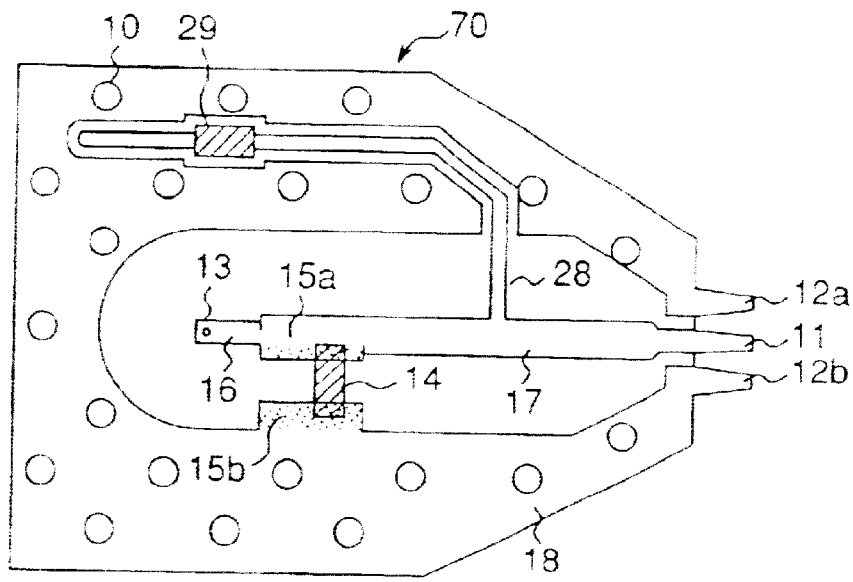
FIG. 12 is a diagram showing the construction of a probe provided with a sense line.
Figure 13:
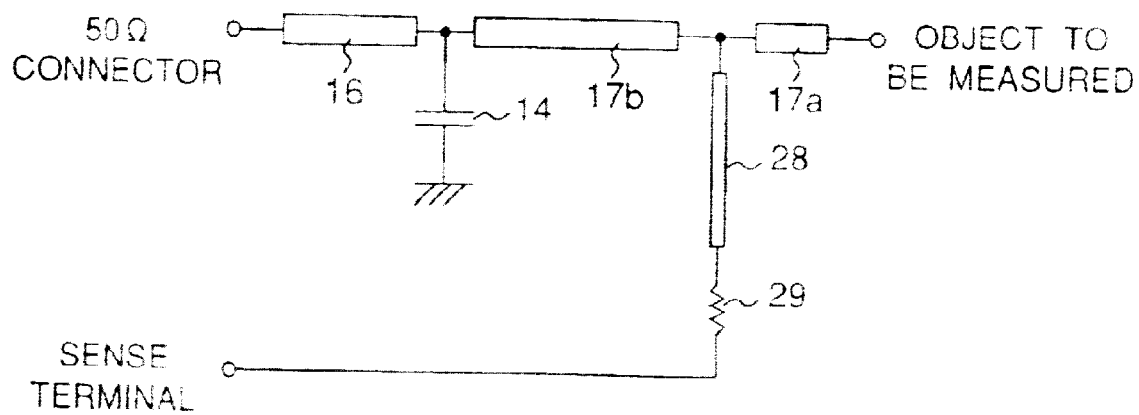
FIG. 13 is a diagram showing an equivalent circuit of the probe of FIG. 12.

FIG. 12 is a diagram showing the construction of a probe 70 according to the first modification example. The same components as those of the probe 1 are denoted by the same reference numerals and no repetitive description is provided for the components. The sense circuit is constructed of a sense line 28 branched from the line 17 and a chip resistor 29 provided at the end portion of the sense line 28. FIG. 13 shows the equivalent circuit of the probe 70 according to the first modification example. In FIG. 13, the line 17 that extends from the terminal 11 to the diverging point of the sense line 28 is indicated by a line 17a, and the line 17 behind the diverging point of the sense line 28 is indicated by a line 17b. As illustrated, in the equivalent circuit of the probe 70 related to the first modification example, the lines 16, 17b and 17a having respective specified impedances are connected in series, a chip capacitor 14 of which the other end is grounded is connected to the junction of the line 16 and the line 17b, and the sense line 28 and the chip resistor 29 are connected between the line 17b and the line 17a.

According to the probe 70 related to the first modification example having the above construction, it is general to employ a high-impedance line for the sense line 28 and employ a high-resistance chip resistor 29 in order to reduce the influence on the signal that flows through the line 17 due to the provision of the sense circuit. A change in the characteristic impedance Zp of the probe 70 caused by the provision of the sense line 28 and the chip resistor 29 can be compensated by changing the mounting position of the chip capacitor 14 or the capacitance value of the chip capacitor 14.

It is to be noted that a choke coil that comes to have a high resistance when a high-frequency signal is inputted may be employed in place of the high-resistance chip resistor 29.

(2-10) Second Modification Example

A second modification example of the probe 1 will be considered below. A probe 71 related to the second modification example employs a high-frequency power amplifier that employs an isolator in, for example, an output section as a circuit to be measured. It is known that the impedance of the isolator is not constant (50 Ω, for example) but changed according to the frequency of the inputted signal. Therefore, when measuring the electric characteristics of the power amplifier provided with the isolator, the impedance $Z_2$ of the probe 1 is required to be matched according to the frequency of the signal outputted from the output section. Therefore, according to the probe 71 of the second modification example, the line 17 connected to the signal input and output terminal 11 is provided with an isolator that exhibits the same frequency-to-impedance characteristic as that of the isolator owned by the power amplifier of the circuit to be measured.

Figure 14:
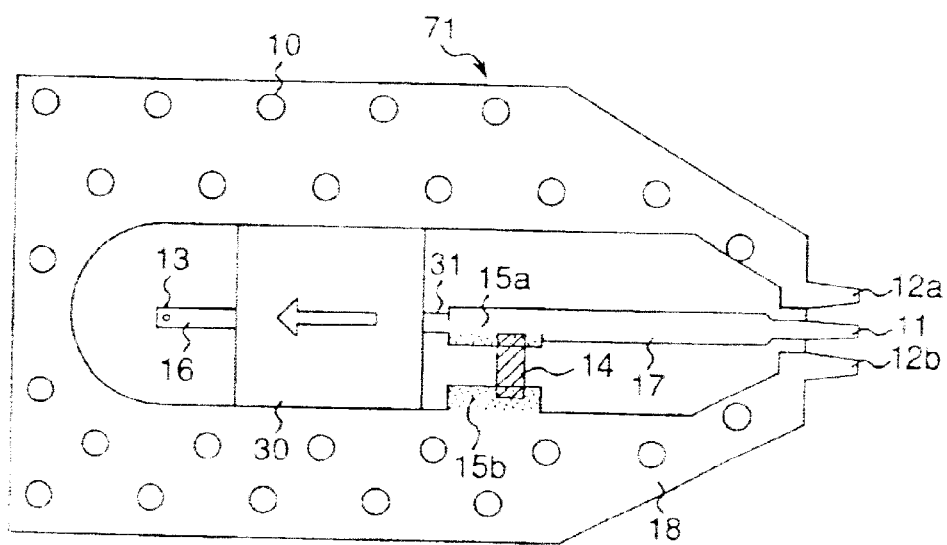
FIG. 14 is a diagram showing the construction of a probe provided with an isolator.

FIG. 14 is a diagram showing the construction of the probe 71 related to the second modification example. The same components as those of the probe 1 are denoted by the same reference numerals, and no repetitive description is herein provided for the components. As illustrated, according to the probe 71 of the second modification example, an isolator of the same frequency-to-impedance characteristic as that of the isolator owned by the power amplifier of the circuit to be measured is provided between the line 31 behind the mounting region 15a of the chip capacitor 14 and the line 16. It is to be noted that the isolator 30 has a size of 7 mm long×7 mm wide×2 mm thick in the case of the surface mounting type for mobile communications, the size being sufficiently acceptable for the mounting of the isolator on the probe 71.

Figure 15:
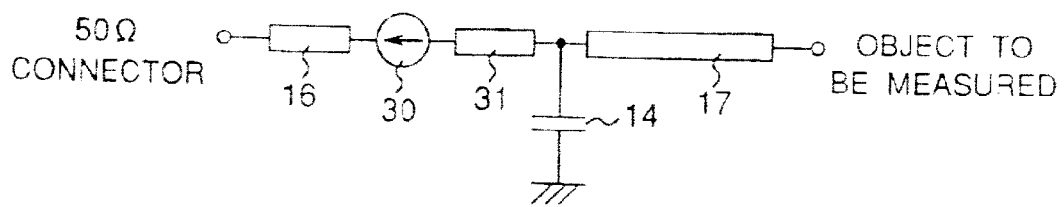
FIG. 15 is a diagram showing an equivalent circuit of the probe of FIG. 14.

FIG. 15 is a diagram showing the equivalent circuit of the probe 71 of the second modification example. In the equivalent circuit of the probe 71 of the second modification example including the line 16, the line 31 and the line 17 that are connected in series, an isolator 30 is provided between the line 16 and the line 31 and the chip capacitor 14 whose one end is grounded is connected to the junction of the line 31 and the line 17. The change in the characteristic impedance $Z_2$ caused by the provision of the isolator 30 is corrected by changing the mounting position of the chip capacitor 14 or the capacitance value of the chip capacitor 14.

With the preparation of the probe 71 having the above construction, appropriate measurement of the electric characteristics can be performed under the same conditions as those in the practical use stage even for a circuit to be measured which is provided with an isolator in the output section and the impedance of which changes according to the frequency of the signal to be outputted.

(3) Second Embodiment

Figure 16:
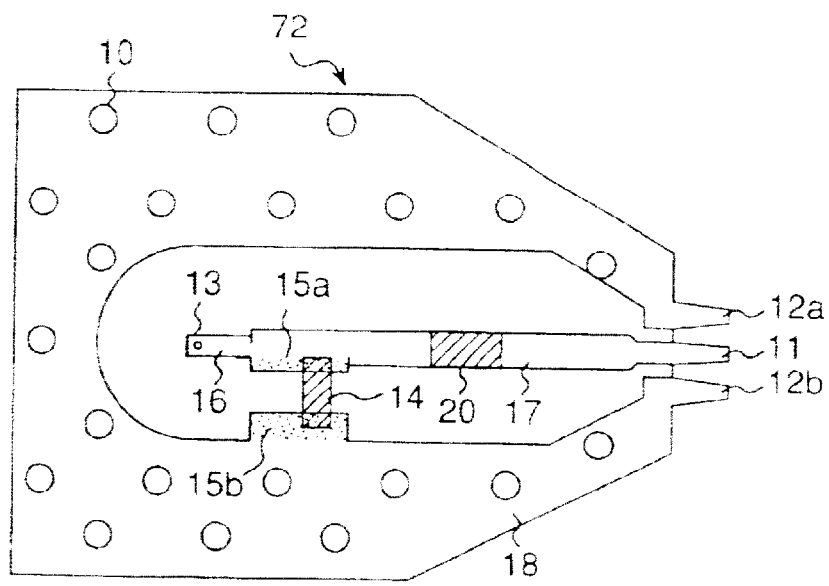
FIG. 16 is a diagram showing the construction of a probe provided with a chip inductor.

A probe 72 related to the second embodiment will be described below. FIG. 16 is a diagram showing the construction of the probe 72 of the second embodiment. The same components as those of the probe 1 of the first embodiment are denoted by the same reference numerals, and no repetitive description is herein provided for the components.

The probe 72 related to the second embodiment is characterized in that, for example, a chip inductor 20 having a size of, 1 mm long×0.5 mm wide or a size of 0.6 mm long×0.3 mm wide is inserted in the line 17 of the probe 1 (see FIG. 1) related to the first embodiment. With the provision of the chip inductor 20, the electrical length can be made longer than the actual length from the signal input and output terminal 11 to the junction 13 to be connected to the connector. In other words, if the inductance component of the required characteristic impedance Zp is constant, then the line 17 can be reduced to allow the probe to be compacted.

By changing the capacitance value of the chip capacitor 14, adjusting the mounting position of the chip capacitor 14 and further changing the value of the chip inductor 20, the characteristic impedance $Z_2$ can be adjusted more in detail and in wider range than the probe 1.

Figure 17:
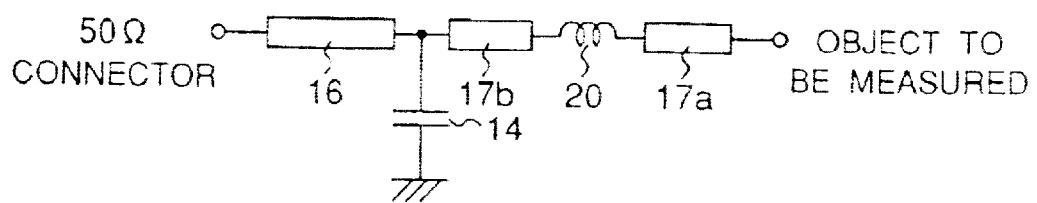
FIG. 17 is a diagram showing an equivalent circuit of the probe of FIG. 16.

FIG. 17 is a diagram showing the equivalent circuit of the probe 72. In FIG. 17, the line 17 extending from the terminal 11 to the chip inductor 20 is indicated by a line 17a, and the line 17 behind the chip inductor 20 is indicated by a line 17b. As illustrated, in the equivalent circuit of the probe 72 related to the second modification example including the lines 16, 17b and 17a that have respective specified impedances and are connected in series, the chip capacitor 14 of which the other end is grounded is connected to the junction of the line 16 and the line 17b, and the chip inductor 20 is inserted between the line 17b and the line 17a.

The probe 72 having the above construction should preferably be provided with a shield conductor 22 (see FIG. 10) similarly to the probe 1 of the first embodiment. This can reduce the bad influence caused by external noises.

The probe 72 having the above construction may be provided with a sense circuit (see FIG. 12) similarly to the first modification example and the second modification example of the first embodiment or with an isolator (see FIG. 14). It is to be noted that the effects in the case where the probe 72 is provided with a sense circuit or an isolator are the same as in the description of the first modification example and the second modification example of the probe 1, and therefore, no repetitive description is herein provided for the components.

(4) Third Embodiment

Figure 18:
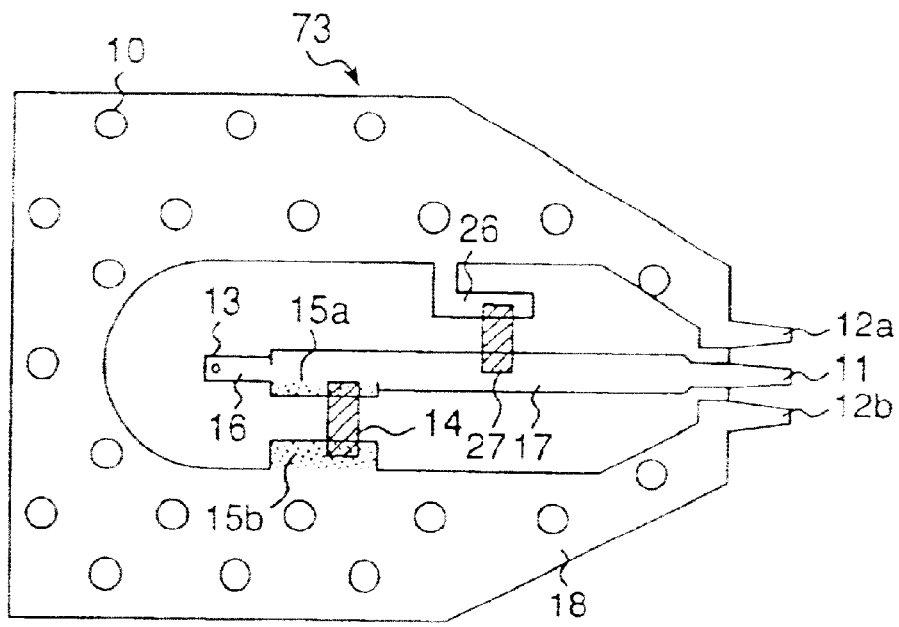
FIG. 18 is a diagram showing the construction of a probe provided with two chip capacitors.

A probe 73 related to the third embodiment will be described below. The probe 73 of the third embodiment is characterized in that a plurality of chip capacitors are connected to the line 17 connected to a signal input and output terminal. FIG. 18 shows the construction of the probe 73 of the third embodiment. The same components as those of the probe 1 of the first embodiment are denoted by the same reference numerals, and no repetitive description is herein provided for the components. As illustrated, the probe 73 of the third embodiment is obtained by providing the probe 1 of the first embodiment further with a branch line 26 that serves as a region in which another chip capacitor is to be mounted, and a chip capacitor 27 is mounted between the branch line 26 and the line 17.

Figure 19:
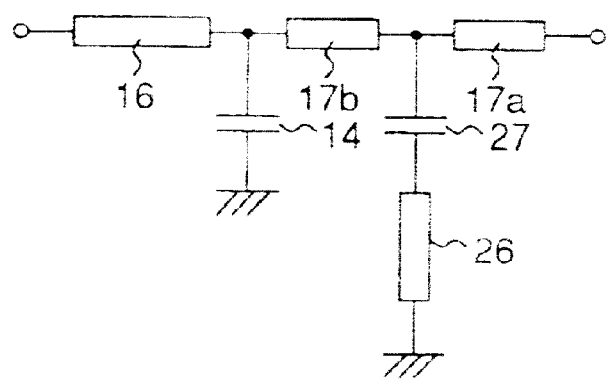
FIG. 19 is a diagram showing an equivalent circuit of the probe.

FIG. 19 is a diagram showing the equivalent circuit of the probe 73 of the third embodiment. In FIG. 19, the line 17 extending from the terminal 11 to the mounting position of the chip capacitor 27 is indicated by a line 17a, and the line 17 behind the mounting position of the chip capacitor 27 is indicated by a line 17b. As illustrated, in the equivalent circuit of the probe 73 related to the third modification example including the lines 16, 17b and 17a that have respective specified impedances and are connected in series, a chip capacitor 14 of which the other end is grounded is connected to the junction of the line 16 and the line 17b, and the chip capacitor 27 and the branch line 26 of the specified impedance are connected to the junction of the line 17b and the line 17a.

By adopting the aforementioned construction, the probe 73 is provided with a 2-stage low-pass type impedance converting circuit constructed of the line 17a, the chip capacitor 27, the line 17b and the chip capacitor 14. This arrangement enables the adjustment of the characteristic impedance $Z_2$ in more detail and in wider range and consequent restraint of the Q-value of the circuit.

Furthermore, by making the LC resonance circuit constructed of the chip capacitor 27 and the branch line 26 resonate with higher harmonics two or three times as high as the frequency of the high-frequency signal inputted to the signal terminal, the short-circuit point of the higher harmonics can be formed at the junction connected to the line 17. Therefore, by setting the impedance of the line 17a to the desired value by adjusting the mounting position of the chip capacitor 14, the probe 73 is able to have the built-in so-called high-frequency matching circuit that totally reflects the higher harmonics in the desired phase. By changing the capacitance value of the chip capacitor 27 and the line length of the branch line 26, the higher harmonics matching adjustment can be easily performed.

The probe 73 having the above construction should preferably be provided with a shield conductor 22 similarly to the probe 1 of the first embodiment (see FIG. 10). This can reduce the bad influence caused by external noises.

The probe 73 having the above construction may be provided with a sense circuit (see FIG. 12) similarly to the first modification example and the second modification example of the probe 1 of the first embodiment or provided with an isolator (see FIG. 14). It is to be noted that the effects in the case where the probe 73 is provided with a sense circuit or an isolator are the same as in the description of the first modification example and the second modification example of the probe 1, and therefore, no repetitive description is herein provided for the components.

According to the first probe for a high-frequency signal of the present invention, the characteristic impedance value can be easily finely tuned by adjusting the capacitance value of the chip capacitor and the mounting position of the chip capacitor. With this arrangement, the number of prototypes for the obtainment of a probe of the desired characteristic impedance can be remarkably reduced.

According to the second probe for a high-frequency signal of the present invention, based on the first probe, the loss of the input signal can be reduced by setting the interval between via holes connected to the back surface ground conductor to a length of not greater than one fourth of the wavelength λ of the inputted signal, allowing the intended stabilized frequency characteristics to be obtained within the intended band.

According to the third probe for a high-frequency signal of the present invention, based on the first or second probe, the size of the probe necessary for obtaining the desired characteristic impedance can be compacted by providing a chip inductor in the first line.

According to the fourth probe for a high-frequency signal of the present invention, based on any one of the first through third probes, the LC resonance circuit constructed of the branched line and the chip capacitor is set so as to resonate with the higher harmonic of a multiple of the frequency of the high-frequency signal inputted to the signal terminal. With this arrangement, the shortcircuit point at the higher harmonic inputted to the signal terminal can be formed at the junction of the first line and the chip capacitor. In the present construction, by adjusting the distance from the chip capacitor mounting position to the signal terminal on the first line, the so-called higher harmonic matching for totally reflecting the high-frequency signal in the desired phase can be achieved by the probe. Furthermore, by changing the capacitance value of the chip capacitor and the line length of the branch line, the high-frequency matching adjustment can be simply executed.

According to the fifth probe of the present invention, based on any one of the first through fourth probes, a correct signal can be applied to the signal terminal by detecting the potential of the signal to be applied from the potential detecting terminal of the signal terminal to the signal terminal.

According to the sixth probe of the present invention, based on any one of the first through fifth probes, a correct electric test can be performed under the same environment as in the practical use state by using the isolator having an impedance characteristic corresponding to the frequency of the inputted signal, identical to the impedance characteristic of the isolator provided in the output section of the circuit to be measured.

According to the seventh probe of the present invention, based on any one of the first through sixth probes, the influence of the external noises and the like can be reduced with the provision of the electromagnetic wave shield conductor, allowing a higher-accuracy electric test to be achieved.

According to the semiconductor device inspecting method of the present invention, more appropriate inspection can be achieved by using any one of the first through seventh probes of which the impedance viewed from the circuit to be measured is correctly set to the desired value.

What is claimed is:

1. A high-frequency signal probe for testing a circuit, the probe comprising:
   a chip capacitor;
   a signal terminal to be connected to a signal electrode of a circuit to be measured;
   a first line that has an impedance, first and second ends, a length extending between the first and second ends, and a first capacitor mounting region extending along part of the length of the first line and transverse the length of the first line for mounting and connecting the chip capacitor to the first line at a plurality of positions along the first line for adjusting a characteristic impedance of the probe, the first end being connected to the signal terminal, and a first terminal of the chip capacitor being mounted on the first capacitor mounting region;
   a second line connected to the second end of the first line, remote from the signal terminal, and having a junction to be connected to a measuring instrument for electrical testing, and an impedance matched to a characteristic impedance of the measuring instrument;
   a ground terminal to be connected to a ground electrode of the circuit to be measured; and
   a ground conductor connected to the ground terminal and having at least one second capacitor mounting region extending opposite and parallel to the first capacitor mounting region for connecting the chip capacitor at a plurality of positions for adjusting the characteristic impedance of the probe and to which a second terminal of the chip capacitor is mounted, wherein the chip capacitor has a specified capacitance and is mounted at positions within the first capacitor mounting region and the second capacitor mounting region so that the characteristic impedance of the probe, viewed from the circuit to be measured, has a desired value.

2. The probe for a high-frequency signal as claimed in claim 1, wherein
   the ground conductor is formed on an insulating substrate having a back surface ground conductor and a plurality of via holes connected to the back surface ground conductor; and
   an interval between each of the via holes and the signal terminal and an interval between via holes are each not greater than one-fourth of a wavelength $\lambda$ of a high-frequency signal input to the signal terminal.

3. The probe for a high-frequency signal as claimed in claim 1, including a chip inductor inserted in the first line.

4. The probe for a high-frequency signal as claimed in claim 1, including a line that is branched from the ground conductor as the second region, wherein the chip capacitor is connected across the branched line and the first region, and the branched line and the chip capacitor form an LC resonant circuit that resonates at a harmonic of a multiple of the frequency of a signal input to the signal terminal.

5. The probe for a high-frequency signal as claimed in claim 1, further comprising a high-impedance branch line branching from the first line proximate the signal terminal and having a terminal for detecting a potential of the signal terminal.

6. The probe for a high-frequency signal as claimed in claim 1, further comprising an isolator that has impedance characteristics corresponding to the frequency of a signal input between the first line and the second line, the impedance characteristics being identical to an isolator provided in an output section of the circuit to be measured.

7. The probe for a high-frequency signal as claimed in claim 1, further comprising a conductor connected to the ground conductor and shielding electromagnetic waves by covering the first line and the second line at a gap.

* * * * *